SUPERCONDUCTIVE CIRCUITS

Filed May 16, 1960 3 Sheets-Sheet 1

INVENTOR
EUGENE S. SCHLIG
BY Frederick J. Smyth
ATTORNEY 3,196,281
SUPERCONDUCTIVE CIRCUITS
Eugene S. Schlig, Crompond, N.Y., assignor to International Business Machines Corporation, New York, N.Y., a corporation of New York
Filed May 16, 1960, Ser. No. 29,545
7 Claims. (Cl. 307—88.5)

This invention relates to superconductive devices and circuits and more particularly to an improved superconducting switching device and to circuits employing this device.

The phenomenon of superconductivity, that is, the ability of certain materials to exhibit zero electrical resistance to the flow of electric current, has been known for some fifty years, and recently has been employed in the design of electrical circuits as shown, by way of example, in U.S. Patents 2,189,122; 2,725,474 and 2,832,897. Specifically, the last mentioned patent is directed to a superconductive switching device, known as a cryotron. The cryotron consists, essentially, of a central wire around which is wound a single-layer coil. The cryotron is maintained at a temperature at which the central wire, or gate conductor, is normally superconducting and thereafter current flow, of at least a predetermined magnitude, through the coil, or control conductor, generates a magnetic field which destroys superconductivity in the gate conductor; the gate conductor then exhibiting electrical resistance. Through the interconnection of various gate and control conductors, a large number of electrical circuits have been designed.

Another cryotron type device is shown in copending application Serial No. 625,512, filed November 30, 1956, on behalf of Richard L. Garwin, and assigned to the assignee of this invention. As shown therein, each of the gate and control conductors consists of a thin film of superconductive material having a thickness very much less than the width of the conductor. Further, since the current distribution in the thin film conductor is not uniformly distributed per unit width, the gate conductor is formed adjacent a superconductive shield plane to thereby attain a more uniform current distribution. The shield is thus effective to increase the magnitude of current the gate conductor can carry before the self-current through the gate is, of and by itself, effective to switch the superconducting gate resistive.

Each of the above briefly described cryotron type devices employ current flow through a control conductor which generates a magnetic field, the field destroying superconductivity in the associated gate conductor. However, since it is the magnitude of magnetic field only, which switches the gate conductor between conduction states, this switching action is independent of the direction of current flow through the control conductor.

A further superconductive switching device is shown in copending application Serial No. 809,818, filed April 29, 1959, now Patent No. 3,138,784, on behalf of John J. Lentz and David J. Dumin and assigned to the assignee of this invention. As there described, this switching device, or guard strip device features a gate element and a control element wherein the switching action of the gate element is dependent on the direction of current flow through the control element. Additionally, it is not the magnetic field generated by current flow through the control element itself which initiates the switching action. Rather, control current modifies the critical current of superconductivity of the gate element, that is the maximum value of current the gate element can conduct without the gate element becoming resistive, by controlling current distribution in the gate strip. In this manner, the state of the gate element, either superconducting or resistive, is determined both by the magnitude of the gate current itself and the value of critical current which is a function of the magnitude and direction of the control current.

What has been discovered is yet another superconductive switching device and circuits employing this device. The device of the invention is related to the guard strip device of the hereinbefore referenced copending application, but differs therefrom in that two control elements are included. This additional control element is effective to increase the critical current of the gate element in the absence of current flow through the control elements. Further, this additional control element is positioned adjacent the surface of the gate element opposite the surface adjacent the first control elements, so that the effect of current flow through one of the control elements is isolated from the other control element by virtue of the intervening superconductive gate element.

It is an object of the invention, therefore, to provide an improved superconductive switching device.

Another object of the invention is to provide an improved guard strip device including two control elements.

A further object of the invention is to provide an improved superconductive amplifier incorporating the switching device of the invention.

Yet another object of the invention is to provide a three element unbiased superconductive switching device which is sensitive to the direction of applied control signals.

Still another object of the invention is to provide a superconductive bistable circuit wherein improved inhibiting circuitry is employed.

The foregoing and other objects, features and advantages of the invention will be apparent from the following more particular description of preferred embodiments of the invention, as illustrated in the accompanying drawings.

Figure 1A:
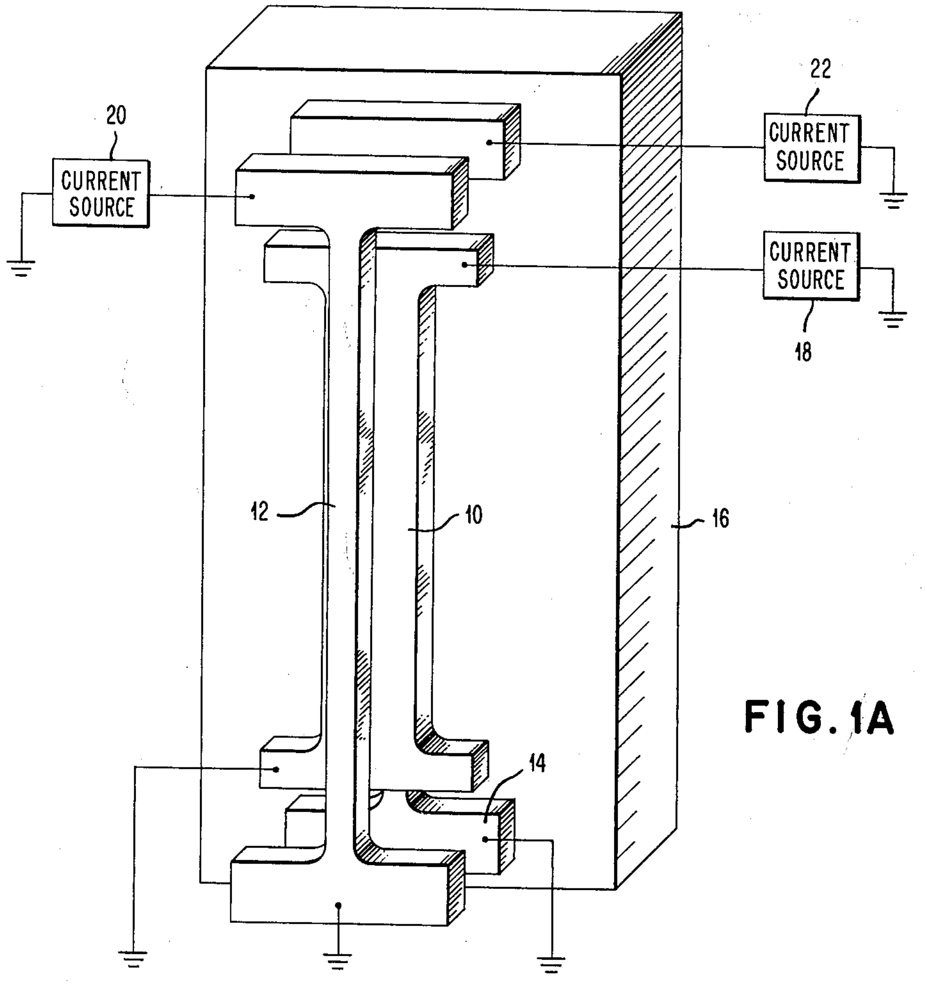
FIG. 1A is a pictorial representation of the superconductive switching device of the invention.

Referring now to the drawings, FIG. 1A is a pictorial representation of the switching device of the invention. As there shown, the device includes a planar gate element, or gate strip, 10, and a pair of planar control elements, or guard strips, 12 and 14, all supported by a substrate 16. In the figure, the thickness of the gate and guard strips is enlarged to show details, it being understood that each of the strips is merely a few thousand Angstrom units in thickness. Further, each of the strips is insulated one from another by a layer of insulating material (not shown) which may be, by way of example, silicon monoxide. Each of the strips and insulating layers are advantageously formed in quantity by the thermal deposition of the material through a pattern defining mask onto substrate 16 in a manner well known to those skilled in the art.

Figure 2:
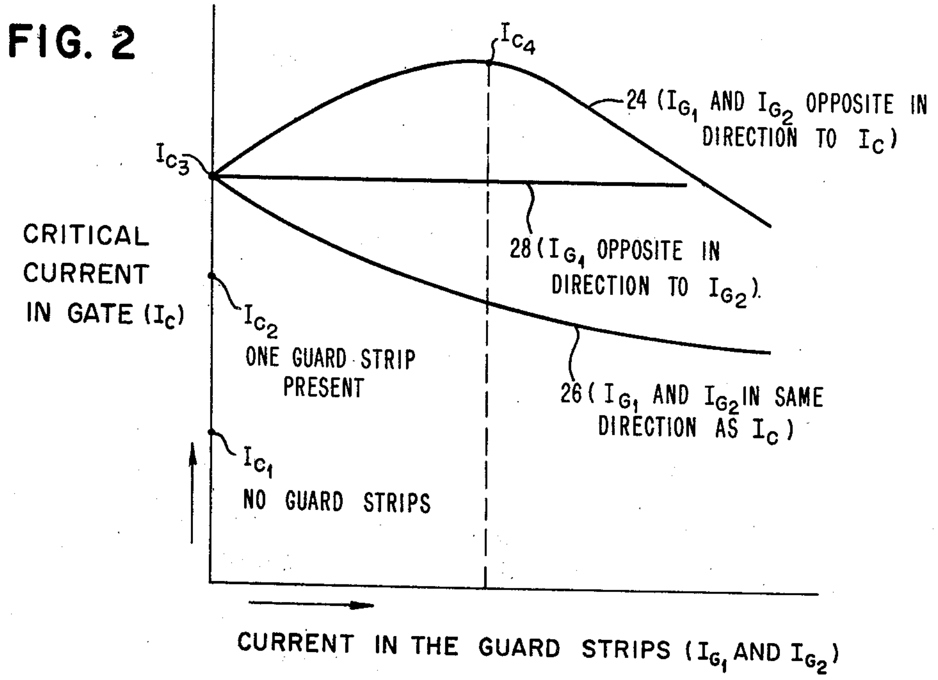
FIG. 2 is curves showing the variation of critical current in the gate element as a function of current flow in the control elements.

Referring now to FIGS. 1A and 2, the operation of the switching device is next described. The device is normally maintained at a sufficiently low temperature such that the gate strip 10 is superconducting. The gate strip 10 therefore is composed of a superconductor material, that is, a material which becomes superconductive at cryogenic temperatures. This gate strip, which may be fabricated of tin by way of example, is capable of carrying a maximum value of current, in the absence of either guard strip, without the gate strip itself switching to the resistive state. The value of this current is indicated at $Ic1$ in FIG. 2. Currents above this value cause the gate strip to become resistive, apparently because of the magnetic field accompanying the current and the resultant localization of portions of the current within the strip. The addition of a first guard strip is effective to increase this maximum value of current to $Ic2$, and the addition of a second guard strip is further effective to increase the maximum value of current to $Ic3$. Current flow through the guard strips is next effective to modify this value of maximum, or critical, current.

As shown in FIG. 1A, a current source 18 delivers a current to gate strip 10, and individual sources 20 and 22, deliver a current to guard strips 12 and 14, respectively. Current from source 18 is normally maintained at a value less than $Ic3$, so that the gate strip is superconducting in the absence of current flow through the guard strips, although in some circuit applications the value may be greater than $Ic3$ as will be more particularly described hereinafter. Referring now to FIG. 2, the variation of critical current in the gate strip is shown as a function of the magnitude and direction of current flow through the guard strips. In FIG. 2, $Ig1$ represents the current from source 20 flowing through guard strip 12 and $Ig2$ represents the current from source 22 flowing through guard strip 14. It can be seen that with equal current flow through each of the guard strips in the same direction one to another and in a direction opposite to the direction of current flow from source 20 through gate strip 10, the critical current in gate strip 10 is initially increased, achieving a maximum value of $Ic4$ as indicated by curve 24. Alternatively, with equal current flow through each of the guard strips in the same direction one to another and in a direction the same as the direction of current flow from source 20 through gate strip 10, the critical current in gate strip 10 is decreased, as indicated by curve 26, below the value $Ic3$, the critical current of gate strip 10 in the absence of current flow in the guard strips. Again with equal current flow in each of the guard strips in opposite directions one to another, the value of critical current in the gate strip is unaltered as shown by curve 28. Thus, depending on the magnitude and direction of current flow through the guard strips, the critical current of gate strip 10 is increased or decreased over the value of $Ic3$, and in conjunction with the magnitude of current flow through gate strip 10, the gate is in the superconducting or resistive conduction state.

Figure 3A:
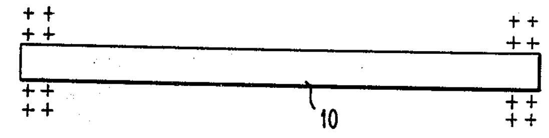
FIG. 3A is a diagrammatical representation of the manner in which the magnetic fiield is distributed about a current carrying thin film conductor in the absence of a magnetic shield.
Figure 3B:
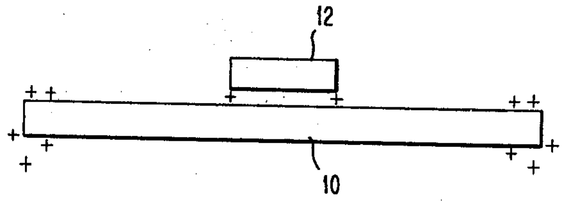
FIG. 3B is a diagrammatical representation of the manner in which the magnetic field is distributed about a current carrying thin film conductor in the presence of a single control element parallel thereto.
Figure 3C:
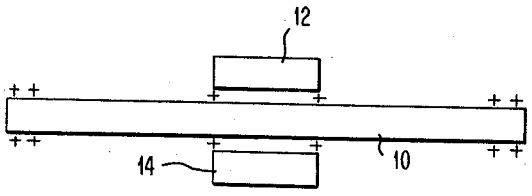
FIG. 3C is a diagrammatical representation of the manner in which the magnetic field is distributed about a current carrying thin film conductor in the presence of a pair of control elements parallel thereto.

The action of the guard strips may best be illustrated with reference to FIGS. 3A, 3B and 3C. FIG. 3A illustrates the distribution of current through a superconducting thin film conductor. Again, in FIGS. 3A, 3B and 3C the thickness of the conductors is enlarged, it being understood that the conductors have a thickness very much less than the width thereof, the thickness being of the order of a few thousand Angstrom units. As shown in FIG. 3A, the major portion of the current is concentrated in the film edges, in contradistinction to a circular wire, by way of example, where the current is uniformly distributed throughout the surface area. FIG. 3B illustrates the improved current distribution obtained with a single guard strip, the guard strip being effective as a shield as shown in the hereinbefore referenced copending application Serial No. 625,512. FIG. 3C illustrates the further improvement obtained through the addition of a second guard strip. Each of FIGS. 3B and 3C represent the current distribution through the gate strip in the absence of current flow through the guard strips.

Next, current flow through the guard strips is further effective to alter the current distribution. Current flow through either of the guard strips in a direction opposite to the direction of current flow through the gate strip is effective to further cause a more uniform current distribution, thereby increasing the critical current. Conversely, current flow through either of the guard strips in the same direction as the flow of current through the gate strip is effective to force a portion of the current in the gate strip flowing adjacent the current carrying guard strip to concentrate at the edges of the gate strip to cause a more non-uniform current distribution, thereby decreasing the critical current. As illustrated in FIGS. 1A, 3B and 3C, the guard strips 12 and 14 each preferably have a width substantially less than the width of the gate strip 10 in order to be most effective for the purpose of the present invention.

Figure 1B:
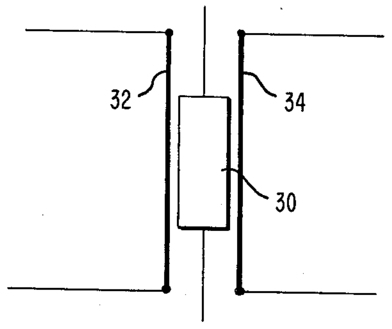
FIG. 1B is a schematic representation of the switching device of FIG. 1A.

The novel superconductive gating device pictorially illustrated in FIG. 1A is represented by the symbol of FIG. 1B in the schematic diagrams which follow. As shown in FIG. 1B, the gate strip is represented by symbol 30, and 32 and 34 represent the pair of guard strips which are effective to control the critical current of gate 30. Although the switching device of the invention is adapted to a large number of circuits, a few embodiments only are next described, it then being apparent the flexibility afforded by the device of the invention.

Figure 4:
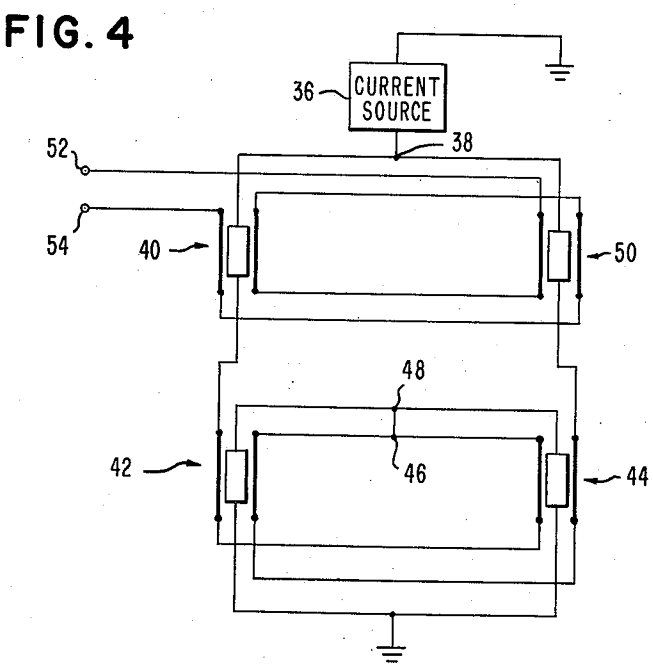
FIG. 4 is a schematic diagram of an amplifier incorporating the switching device of the invention.

Referring now to FIG. 4, there is shown a multistage amplifier employing the device of the invention, wherein a single current source is sufficient to bias each amplifier stage. Current from source 36 is fed to a junction 38 and thence to ground through a pair of parallel paths. The first path includes the gate strip of switching device 40, a first guard strip of switching device 42, a first guard strip of switching device 44, junctions 46 and 48 and the gate strip of device 42. The second path includes the gate strip of switching device 50, a second guard strip of device 44, a second guard strip of device 42, junctions 46 and 48, and the gate strip of device 44. From the circuit symmetry and assuming identical switching devices, the usual but not necessary condition, current from source 36 arriving at junction 38 divides equally between the first and second paths. With identical switching devices, it is seen that each of the devices has the same value of critical current, with no signals applied to the input terminals 52 and 54. This occurs since with no current flow in the guard strips of devices 40 and 50, each of these devices has a value of critical current indicated as $Ic3$ in FIG. 2. Further, each of devices 42 and 44 also has a critical current of $Ic3$. This results from the fact that although current flows through the guard strips of these devices, the current flow in each pair of guard strips is in opposite directions resulting in curve 28 of FIG. 2 being obtained. More particularly, with respect to device 42, current flows in a downward direction in the first guard strip and in an upward direction through the second guard strip. Similarly, with respect to device 44, current flows in an upward direction in the first guard strip and in a downward direction in the second guard strip. Thus, with source 36 adjusted to supply a current equal in value to $2Ic3$, each gate strip of devices 40, 42, 44 and 50 conducts a current equal to the critical current thereof.

The application of signal currents to terminals 52 and 54 is effective to modify the critical currents of the switching devices resulting in a shifting of the current supplied by source 36 between the first and second paths. Since the magnitude of current shifted can be greater than the magnitude of the applied signal current, amplification is possible. By way of example, assume the signal current at a particular instant in time to be flowing from terminal 54 towards terminal 52. This signal current flow is effective to decrease the critical current of the gate strip of device 40 and to increase the critical current of device 50. This occurs because the direction of current flow through each of the guard strips of device 40 is in the same direction as current flow through the gate strip thereof (see curve 26 of FIG. 2) and the direction of current flow through each of the guard strips of device 50 is in the opposite direction as current flow through the gate strip thereof (see curve 24 of FIG. 2). This change in critical current of device 40 tends to cause the gate strip of device 40 to switch to the resistive state, since the critical current is lowered below the value of current original conducted by the gate strip, that is Ic3. For this reason a portion of the current flowing through the gate strip of device 40 shifts into the second path and flows through the gate strip of device 50. This gate strip remains superconducting with this shifted current flowing therethrough in addition to the original magnitude of Ic3, since the signal currents flowing through the guard strips of device 50 effectively increase the critical current of the gate strip thereof as hereinabove described.

The second stage of the amplifier, and also any further stages, additionally undergoes a current shift between paths when signals are applied to terminals 52 and 54. Continuing with the above example with signal current flowing from terminal 54 to terminal 52 and a current greater than Ic3 flowing through the gate strip of device 50 and a current less than Ic3 flowing through the gate strip of device 40 as a result thereof, these currents flowing through the guard strips of devices 42 and 44 are effective to increase the critical current of device 42 and decrease the critical current of device 44. Consider first device 42. The current flow through the first guard strip in the same direction as current flow through the gate strip is reduced, increasing the critical current of the gate strip. Simultaneously, the current flow through the second guard strip in the opposite direction as current flow through the gate strip is increased, further increasing the critical current of the gate strip. These two effects are additive, resulting in the gate strip having a critical current in excess of Ic3. In a similar manner, each of the guard strips of device 44 is individually effective to reduce the critical current of the guard strip since there the increased current flow is in the same direction as current flow through the gate and the decreased current flow is in the opposite direction of the gate current. Since the critical current of the gate of device 44 is reduced below the original current Ic3 flowing therethrough, a portion of the current flowing therethrough is shifted to flow through the gate strip of device 42 to maintain each of the gate strips superconducting.

Reversal of the direction of signal current flow is effective to produce a corresponding reversal of the direction of current shift in each amplifier stage. Further, the amplifier is additionally operable with each of the gate strips conducting a current greater than the critical current provided the $I^2R$ heating can be be tolerated at the superconductive temperature at which the amplifier is operated.

Figure 5:
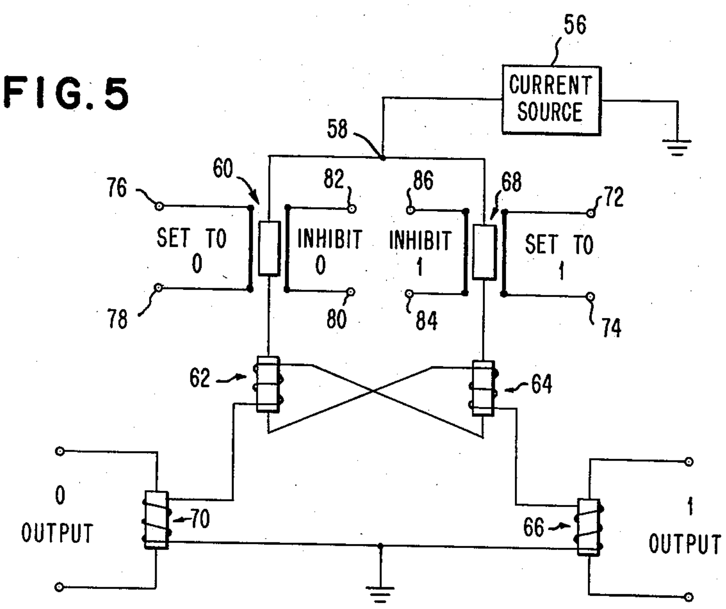
FIG. 5 is a schematic diagram of a bistable circuit including the inhibiting circuitry of the invention.

Referring now to FIG. 5, there is shown a bistable flip-flop circuit wherein the superconductive switching device of the invention is employed to provide an inhibit features to the circuit. Current from a source 56 flows to a terminal 58 and thence to ground through one of a pair of superconductive paths. The first path includes the gate strip of a switching device 60, the gate conductor of a first holding cryotron 62, the control conductor of a second holding cryotron 64 and the control conductor of an output cryotron 66. The second path includes the gate strip of a switching device 68, the gate conductor of the second holding cryotron 64, the control conductor of the first holding cryotron 62 and the control conductor of an output cryotron 70. Through the interconnection of the gate and control conductors of the holding cryotrons 66 and 70, current flow through one superconducting path causes the other path to be resistive thereby maintaining all of the current flowing through the superconducing path. With current flowing in the second or 0 path, current applied to terminals 72 and 74 is effective, in conjunction with the current from source 56, to cause the gate strip of device 68 to switch to the resistive state. With each of the current paths resistive, the current divides between the paths reducing the resistance in the first path (decreased current flow through the control conductor of cryotron 62) and increasing the resistance in the second path (increased current flow through the control conductor of cryotron 64). This current shift is cumulative until the entire current flows in a superconducting first path. The application of current to terminals 76 and 78 is thereafter effective to return the current to the second path in a similar manner. However, the application of a current flow from terminal 80 through a guard strip of device 60 to terminal 82 as well as current flow from terminal 84 through a guard strip of device 68 to terminal 86 is sufficient to prevent either of the above current shifts from accruing. With reference again to FIG. 2 and assuming for simplicity, the current at terminals 80 and 82 and 84 and 86 to be equal in magnitude to signals applied at terminals 72 and 74 and 76 and 78, it is seen that the critical current of the gate strips is reduced only to Ic3, the gate strip remaining superconducting.

Further, the circuit of FIG. 5 is operable in various alternate modes. By way of example, biasing currents may be supplied to each pair of terminals 80, 82 and 84, 86 in the same direction as the current flow from source 56 through the gate strips of devices 60 and 68 to thereby increase the sensitivity of the switching action to signals applied to terminals 72 and 74, and 76 and 78. Additionally, a half-select mode of operation may be employed wherein signals are applied simultaneously to either terminals 72 and 74, and 84 and 86 or 76 and 78, and 80 and 82.

Since the apparatus for attaining and maintaining a superconductive temperature is well known to those skilled in the art it has neither been shown nor described herein. Further, the cryotrons in FIG. 5 have been illustrated as including coils only for purposes of clarity, it being understood that thin film cryotrons of the hereinbefore referenced copending application Serial No. 625,-512 are to be preferred.

While the invention has been particularly shown and described with reference to preferred embodiments thereof, it will be understood by those skilled in the art that various changes in form and details may be made therein without departing from the spirit and scope of the invention.

What is claimed is:

1. A superconductive switching device comprising; a planar gate strip of superconductor material; a pair of planar guard strips of superconductor material; said guard strips being positioned longitudinally parallel to and on opposite sides of said gate strip; each of said guard strips being effective in the absence of current flow therethrough to increase the critical current of superconductivity of said gate strip; and being further effective when current flows therethrough to vary the critical current of superconductivity of said gate strip about said increased value, the variation being determined by the magnitude and direction of current flow through each of said guard strips and current supply means coupled to said gate strip and to each of said pair of guard strips.

2. A superconductive switching device comprising; a thin planar gate strip means supplying current to said gate strip of superconductor material; means for increasing the critical current of superconductivity of said gate strip including a pair of guard strips of superconductor material, each of said guard strips having a width substantially less than the width of said gate strip and positioned longitudinally parallel to and on opposite sides of said gate strip; and means for modifying the increased critical current of superconductivity of said gate strip including current supply means for each of said guard strips.

3. A superconductive switching device comprising; a thin film gate strip of superconductor material; a pair of thin film guard strips of superconductor material; said guard strips positioned longitudinally parallel to and on opposite sides of said gate strip; current supply means coupled to each of said guard strips; said guard strips being effective when current flows therethrough in a first direction to increase the critical current of superconductivity in said gate strip; said guard strips being effective when current flows therethrough in a second direction to decrease the critical current of superconductivity in said gate strip; and said guard strips being ineffective to alter the critical current of superconductivity of said gate strip when equal currents flow in a first direction through one of said guard strips and in a second direction through the other of said guard strips.

4. A superconductive switching device comprising; a planar gate element of superconductor material; a first control element of superconductor material for applying signals to said gate element; a second control element of superconductor material for applying signals to said gate element; said control elements being spaced on opposite sides of said gate element and separated by said gate element; current supply means coupled to each of said first and second control elements; one of said control elements responsive to current flow therethrough for determining the magnitude of current flow through the second of said control elements required to switch said gate element between the superconducting and resistive conduction states when said device is operated at a superconductive temperature.

5. A superconductive switching device comprising; a planar gate element of superconductor material; a pair of planar control elements of superconductor material on opposite sides of and separated by said gate element for applying signals thereto; first current supply means for one of said control elements; second current supply means for the other of said control elements; third current supply means for said gate element; the effect of current flow through one of said control elements on the critical current of superconductivity of said gate element being different when current flows through the other of said control elements than in the absence of current flow in the other of said control elements.

6. The device of claim 5 wherein the direction of current flow through said other control element increases the critical current of superconductivity in said gate element.

7. The device of claim 5 wherein the direction of current flow through said other control element decreases the critical current of superconductivity in said gate element.

References Cited by the Examiner

UNITED STATES PATENTS

| | | | |
|---|---|---|---|
| 2,938,160 | 5/60 | Steele | 323—94 |
| 3,093,754 | 6/63 | Mann | 307—88.5 |
| 3,115,612 | 12/63 | Meissner | 307—88.5 X |

OTHER REFERENCES

Proceedings of the IRE, September 1960, pages 1569 to 1582.

JOHN W. HUCKERT, *Primary Examiner.*

HERMAN KARL SAALBACH, *Examiner.*